(12) United States Patent
Takai et al.

(10) Patent No.: US 8,120,230 B2
(45) Date of Patent: Feb. 21, 2012

(54) ACOUSTIC WAVE DEVICE

(75) Inventors: Tsutomu Takai, Kanazawa (JP);
Norihiro Hayakawa, Moriyama (JP);
Taro Nishino, Yasu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 21 days.

(21) Appl. No.: 12/784,564

(22) Filed: May 21, 2010

(65) Prior Publication Data

US 2010/0219717 A1   Sep. 2, 2010

Related U.S. Application Data

(63) Continuation of application No. PCT/JP2008/069567, filed on Oct. 28, 2008.

(30) Foreign Application Priority Data

Nov. 28, 2007   (JP) ................................. 2007-307650

(51) Int. Cl.
*H03H 9/25* (2006.01)
(52) U.S. Cl. ................................... 310/313 R; 310/340
(58) Field of Classification Search .............. 310/313 R, 310/313 B, 340
See application file for complete search history.

(56) References Cited

U.S. PATENT DOCUMENTS

| | | | |
|---|---|---|---|
| 4,978,879 A * | 12/1990 | Satoh et al. ................ | 310/313 A |
| 5,846,708 A * | 12/1998 | Hollis et al. .................... | 506/12 |
| 6,326,282 B1 | 12/2001 | Park et al. | |
| 6,528,924 B1 | 3/2003 | Stelzl et al. | |
| 2001/0001293 A1 * | 5/2001 | Gotoh et al. .................. | 438/107 |
| 2003/0062969 A1 | 4/2003 | Inoue | |
| 2003/0080649 A1 | 5/2003 | Araki | |
| 2004/0227431 A1 | 11/2004 | Mishima | |
| 2007/0278898 A1 * | 12/2007 | Miura et al. .............. | 310/313 R |

FOREIGN PATENT DOCUMENTS

| | | |
|---|---|---|
| JP | 4-42604 A | 2/1992 |
| JP | 6-77478 A | 3/1994 |
| JP | 7-254835 A | 10/1995 |
| JP | 11-31759 A | 2/1999 |
| JP | 11-510666 A | 9/1999 |
| JP | 11-330227 A | 11/1999 |
| JP | 2001-44787 A | 2/2001 |
| JP | 2002-151997 A | 5/2002 |
| JP | 2003-101381 A | 4/2003 |
| JP | 2003-198321 A | 7/2003 |
| JP | 2004-254287 A | 9/2004 |
| JP | 2006-19550 A | 1/2006 |
| JP | 2007-110342 A | 4/2007 |

OTHER PUBLICATIONS

Official Communication issued in International Patent Application No. PCT/JP2008/069567, mailed on Dec. 22, 2008.

* cited by examiner

*Primary Examiner* — Thomas Dougherty
(74) *Attorney, Agent, or Firm* — Keating & Bennett, LLP (57) ABSTRACT

An acoustic wave device includes an acoustic wave element including an IDT electrode provided on a substrate, and a protective film arranged to cover the acoustic wave element so as to stabilize characteristics. The protective film is a silicon nitride film composed of silicon and nitrogen as main components and when a composition ratio of the silicon to the nitrogen is represented by 1:X, X is about 1.15 or less.

9 Claims, 6 Drawing Sheets

ACOUSTIC WAVE DEVICE

BACKGROUND OF THE INVENTION

1. Field of the Invention

The present invention relates to an acoustic wave device, and specifically to a protective film of an acoustic wave device.

2. Description of the Related Art

In general, in semiconductors and acoustic wave devices, such as surface acoustic wave devices, protective films are provided to prevent corrosion of the electrodes and other elements caused by moisture.

Figure 7:
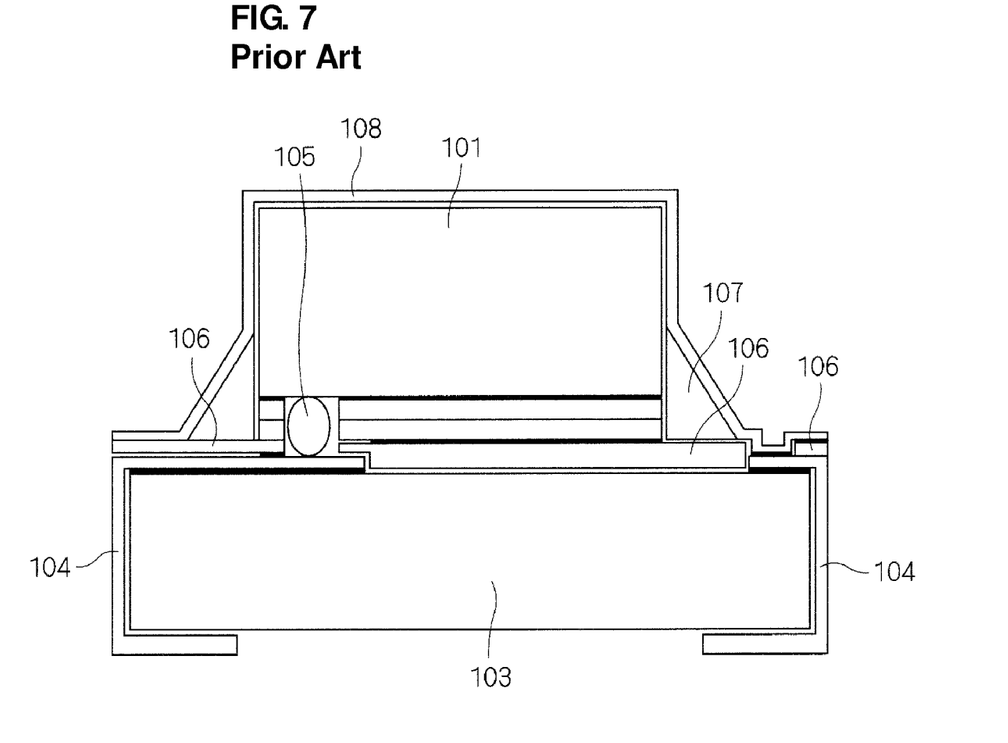
FIG. 7 is a sectional view of a known acoustic wave device.

For example, for a surface acoustic wave device shown in a sectional view of FIG. 7, a configuration is disclosed in which a substrate 101 mounted on a base plate 103 is covered with a protective film 108. In detail, conductive structures (not shown), such as an IDT electrode, are provided on the substrate 101. The conductive structures on the substrate 101 are sealed with the protective film 108. The substrate 101 is electrically connected to a conductor 104 of the base plate 103 through bumps 105. An insulating layer 106 is disposed between the substrate 101 and the base plate 103, and an enclosing frame 107 is provided in a connection region between the substrate 101 and the base plate 103 using a resin or other suitable material (refer to, for example, Japanese Unexamined Patent Application Publication No. 11-510666).

As a protective film, for example, a silicon nitride film is used. The term "silicon nitride film" generally represents a film having a Si:N composition ratio of 3:4 corresponding to stoichiometric ratio $Si_3N_4$ and when the film is represented by $SiN_X$, $X=4/3=1.33$.

However, the function of preventing the entrance of moisture is deteriorated due to oxidation with moisture and moisture absorption of the protective films.

In particular, in a surface acoustic wave device which causes corrosion of an electrode and a change in material constants with a small amount of moisture, corrosion of an IDT electrode can be suppressed to some extent by a protective film. However, a problem occurs in which SAW energy is also distributed in the protective film, and thus, the sonic speed of the protective film is changed by a change in material constants of the protective film due to moisture, thereby deteriorating the characteristics.

SUMMARY OF THE INVENTION

To overcome the problems described above, preferred embodiments of the present invention provide an acoustic wave device including a protective film that is capable of stabilizing the characteristics of the acoustic wave device.

An acoustic wave device according to a preferred embodiment of the present invention includes an acoustic wave element including an IDT electrode provided on a substrate, and a protective film arranged to cover the acoustic wave element. The protective film is preferably a silicon nitride film composed of silicon and nitrogen as main components and when a composition ratio of the silicon to the nitrogen is represented by 1:X, X is preferably about 1.15 or less, for example.

The acoustic wave element preferably utilizes an acoustic wave, such as a surface acoustic wave (SAW), a boundary wave, or other suitable acoustic wave. The acoustic wave device may preferably include a plurality of acoustic wave elements provided on a common substrate or may be miniaturized to a chip-size package (CSP) as long as at least one acoustic wave element is provided.

When the silicon nitride film as the protective film is represented by $SiN_X$, $X \leq 1.15$, and thus, the ratio of silicon is relatively large, and the ratio of nitrogen is relatively small as compared to a known silicon nitride film wherein $X=1.33$. By using such a silicon-rich silicon nitride film, characteristic deterioration of the acoustic wave device due to humidity can be decreased.

The protective film can have the following various configurations.

The acoustic wave element may preferably further include a $SiO_2$ film provided on the substrate including the IDT electrode. The protective film is preferably arranged on the $SiO_2$ film.

Alternatively, the acoustic wave element may preferably further include a cover sheet provided on the substrate so as to define a space on the IDT electrode. The protective film is preferably arranged on the cover sheet.

Alternatively, the acoustic wave device may preferably further include a common substrate on which a plurality of the acoustic wave elements are mounted. The protective film is preferably arranged to cover the plurality of acoustic wave elements mounted on the common substrate.

X preferably exceeds about 1.00, for example.

In this case, when the silicon nitride film used as the protective film is represented by $SiN_X$, $1.00 < X \leq 1.15$. If $X > 1.00$, variations in the initial characteristics of the acoustic wave device are less than that in a case of $X \leq 1.00$.

X is preferably less than about 1.00.

In this case, when the silicon nitride film used as the protective film is represented by $SiN_X$, $X < 1.00$. If $X < 1.00$, variation in the frequency characteristics of the acoustic wave device with humidity load is less than that in a case of $X \geq 1.00$.

X is more preferably less than about 0.60.

In this case, variations in the frequency characteristics with humidity load and standard deviation σ thereof are further improved.

X more preferably exceeds about 0.2.

In this case, when the silicon nitride film as the protective film is represented by $SiN_X$, $X > 0.2$. If $X < 0.2$, the silicon nitride film as the protective film can be easily formed.

X is preferably less than 0.6 and exceeds 0.2.

In this case, preferred conditions are provided for a certain type of application from the comprehensive viewpoint of a variation in the frequency characteristics with humidity load, standard deviation σ thereof, and standard deviation of measurements of initial characteristics.

X may preferably be zero.

In this case, a variation in the frequency characteristics with humidity load can be minimized.

According to various preferred embodiments of the present invention, when a silicon nitride film used as a protective film is silicon-rich, a decrease in the function of a protective film can be prevented, and the characteristics of an acoustic wave device can be stabilized.

These and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described below with reference to FIGS. 1 to 6.

An acoustic wave device 11 according to a preferred embodiment of the present invention is described with reference to FIG. 1.

Figure 1:
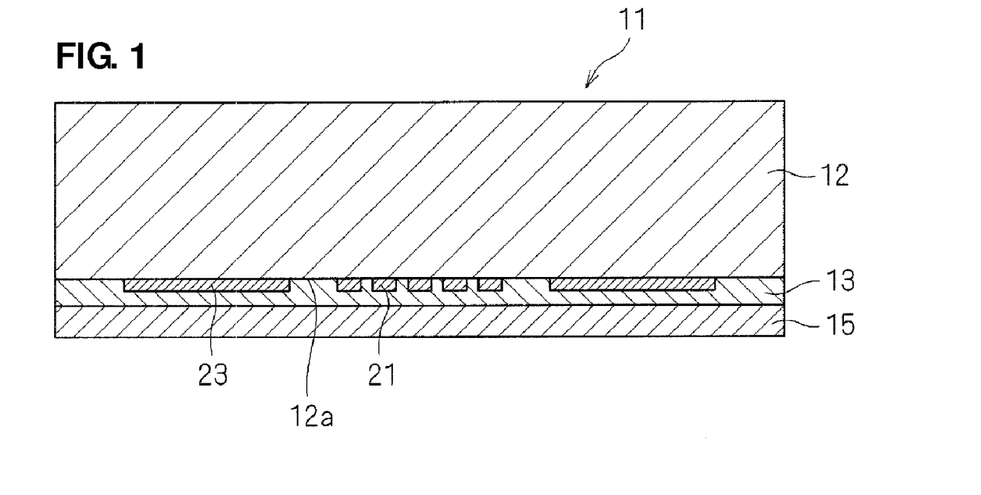
FIG. 1 is a sectional view of an acoustic wave device according to a preferred embodiment of the present invention.

FIG. 1 is a sectional view of the acoustic wave device 11.

As shown in FIG. 1, the acoustic wave device 11 includes an acoustic wave element in which a comb-shaped IDT electrode 21, a pad 23, and a conductive pattern including a wiring pattern (not shown) are provided on the lower surface 12a of a substrate 12. The acoustic wave device 11 is, for example, a surface acoustic wave device (SAW device), a piezoelectric substrate of $LiTaO_3$, $LiNbO_3$, or other suitable material is preferably used as the substrate 12, and the acoustic wave element defines a surface acoustic wave element.

The entire lower surface 12a of the piezoelectric substrate 12 including the IDT electrode 21 is covered with a $SiO_2$ film 13. The $SiO_2$ film 13 is arranged to control temperature characteristics. A protective film 15 is disposed outside of the $SiO_2$ film 13. The IDT electrode 21 is protected by the protective film 15. When the acoustic wave device 11 is a surface acoustic wave device (SAW device), the frequency characteristics can be controlled by controlling the thickness of the protective film 15.

The protective film 15 is preferably a silicon nitride film, for example, formed to be silicon-rich by controlling the deposition conditions of deposition by a plasma CVD method or other suitable method.

The term "silicon nitride film" generally represents a film having a Si:N composition ratio of 3:4 corresponding to stoichiometric ratio $Si_3N_4$, and when the Si:N composition ratio is represented by 1:X, i.e., when the film is represented by $SiN_X$, substantially X=4/3=1.33.

However, the protective film 15 of the acoustic wave device 11 is a silicon-rich silicon nitride film in which the ratio of a silicon component is relatively large, and the ratio of a nitrogen component is relatively small as compared to a silicon nitride film having the typical composition ratio. In other words, for the protective film 15, a silicon-rich silicon nitride film is formed so that X is preferably less than that (X=1.33) of a silicon nitride film formed under typical deposition conditions, for example, preferably so that X≦1.15.

The silicon-rich silicon nitride film used as the protective film 15 is prevented from being oxidized in a wet atmosphere and very effectively prevents moisture permeation as compared to a silicon nitride film having a typical composition ratio. The highly effective moisture permeation suppression effectively prevents changes with moisture of the IDT electrode 21 provided inside the protective film 15. In addition, the oxidation of the protective film 15 is prevented, thereby causing very little change of the function of the protective film over time. When the acoustic wave device 11 is a surface acoustic wave device (SAW device), the protective film 15 produces a very small change of sonic speed because the oxidation of the protective film 15 is prevented, and a change of characteristics with time is very small.

Therefore, the characteristics of the acoustic wave device 11 can be stabilized.

Next, an example of the preparation of the acoustic wave device 11 is described with reference to FIGS. 4 to 6.

A metal film was patterned on a piezoelectric substrate to form a surface acoustic wave (SAW) filter, and a silicon-rich silicon nitride film was formed as the protective film 15 by a plasma CVD method at a deposition temperature of about 150° C., for example. The composition ratio 1:X of nitrogen to silicon was changed to prepare protective films 15 having different composition ratios 1:X, and a humidity load test was performed. The composition ratio 1:X of nitrogen to silicon was determined by measuring the concentrations of elements by a Rutherford back scattering method (RBS).

The frequency of each sample of the silicon nitride films as the protective films 15 having different composition ratios 1:X of nitrogen to silicon was measured before and after the humidity load test. The conditions for the humidity load test included a temperature of about 85° C. and a relative humidity of about 85%, for example.

Figure 4:
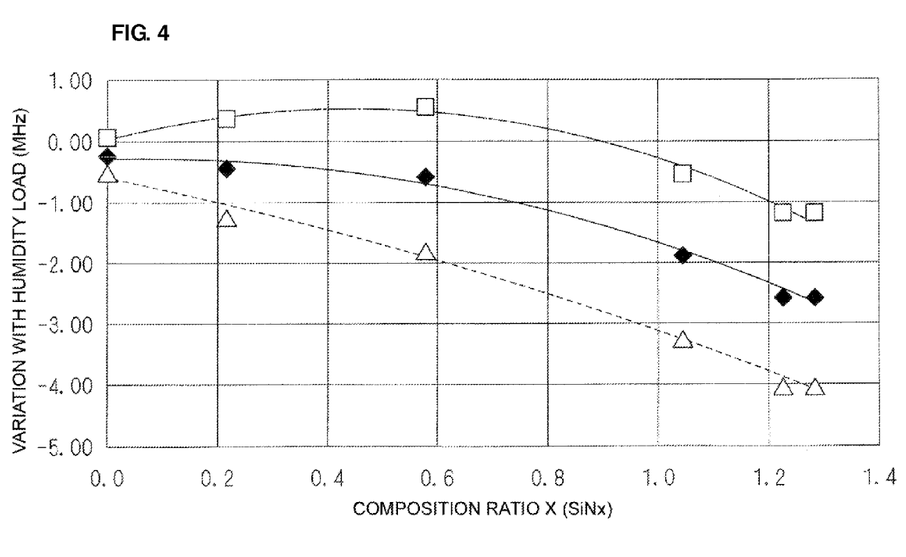
FIG. 4 is a graph showing a relationship between a composition ratio and variation in frequency with humidity load of the acoustic wave device shown in FIG. 1.
Figure 5:
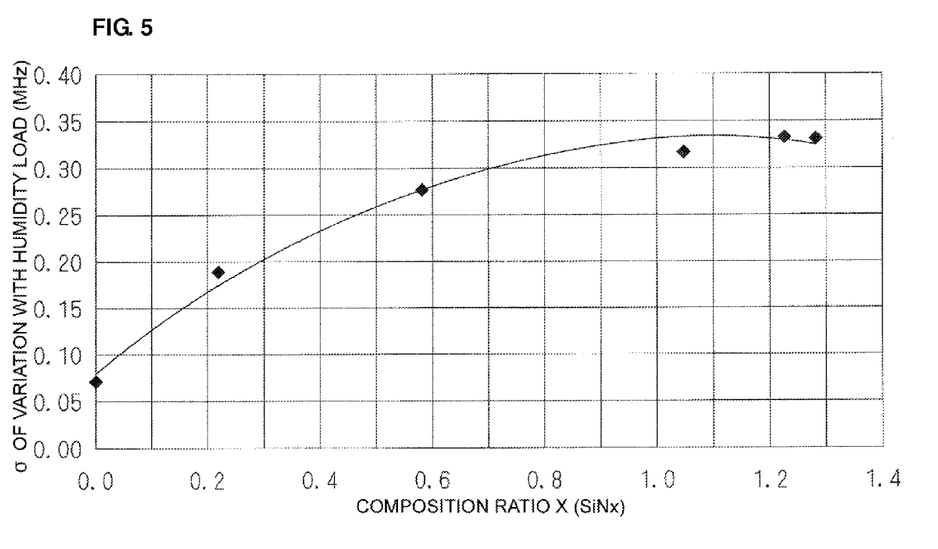
FIG. 5 is a graph showing a relationship between a composition ratio and σ of variation in frequency with humidity load of the acoustic wave device shown in FIG. 1.
Figure 6:
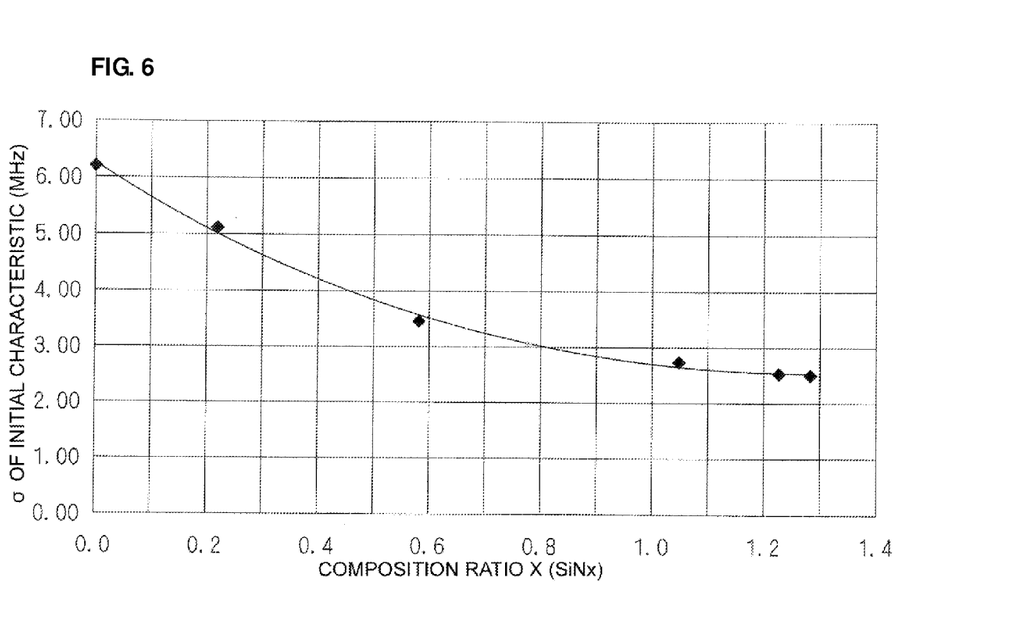
FIG. 6 is a graph showing a relationship between a composition ratio and variation in initial frequency of the acoustic wave device shown in FIG. 1.

FIGS. 4 to 6 are graphs showing the measurement results at X≧0. Any one of the graphs shows values (reduced values) at the deposition temperature of about 150° C.

FIG. 4 is a graph showing variation of frequency characteristics with humidity load (difference in frequency characteristics before and after the humidity load test). In FIG. 4, X of the composition ratio 1:X of nitrogen to silicon of the silicon nitride film is shown in the abscissa, and variation of frequency characteristics with humidity load (difference in frequency characteristics before and after the humidity load test) is shown in the ordinate. In FIG. 4, "♦" represents an average of variation with humidity load, and "□" represents "(average of variation with humidity load) +3σ". "Δ" represents "(average of variation with humidity load) −3σ", and σ represents a standard deviation.

The frequency of a SAW filter changes with power resistance and various environmental loads, such as temperature and humidity. However, it is preferable that an absolute value of variation of frequency characteristics is about 3.5 MHz or less as a value derived from a variation which can satisfy the target characteristics as a filter even when the environmental loads are changed. Here, this condition is referred to as an "environmental load resistant condition".

FIG. 4 indicates that when X≦1.15, a variation in frequency characteristics with humidity load is within a range of about −3.5 MHz to about +1.00 MHz, and an absolute value of the variation in frequency characteristics is about 3.5 MHz or less, thereby satisfying the environmental load resistant condition.

FIG. 5 is a graph showing the standard deviation σ of variation of frequency characteristics with humidity load. In FIG. 5, as in FIG. 4, X is shown in the abscissa, and the standard deviation σ of variation of frequency characteristics with humidity load is shown in the ordinate. As shown in FIG. 5, σ decreases as X decreases. It is preferable that X<1.00 because σ is smaller than that in the case of X≧1.00, and a variation in frequency characteristics with humidity load is decreased. When X is less than about 0.60, variation in frequency characteristics with humidity load and standard derivation σ are further improved.

In particular, X=0 is more preferable because σ is minimized, and thus, the variation in frequency characteristics with humidity load can be minimized. When X=0, the protective film is a silicon nitride film in a broad sense, but is a silicon film in a narrow sense.

FIG. 6 is a graph showing the standard deviation σ of measurements of initial characteristics (frequency characteristics before the humidity load test). In FIG. 6, as in FIG. 4, X is shown in the abscissa, and the standard deviation σ of measurements of initial characteristics (frequency characteristics before the humidity load test) is shown in the ordinate. As shown in FIG. 6, σ decreases and the variation of initial characteristics decreases as X increases. It is preferable that X>1.00 because the variation of initial characteristics is smaller than that in the case of X≦1.00. When X>1.00, σ is substantially constant, and thus, if X slightly changes, the variation in initial characteristics is not significantly affected, thereby facilitating manufacture of the acoustic wave device.

In addition, X is preferably in a range of about 0.20 to about 0.60, for example, for a specific type of application from the comprehensive perspective of a variation in the frequency characteristics with humidity load, standard deviation σ thereof, and standard deviation of measurements of the initial characteristics.

The same test was performed by changing only the deposition temperature from about 150° C. to each of about 220° C., about 260° C., and about 290° C. As a result, the absolute value of variation in the frequency (standard deviation σ) decreased as the deposition temperature increased from about 150° C. Therefore, (a) it is preferable that X≦1.15 because the environmental load resistant condition is satisfied, (b) it is preferable that X<1.00 because the variation in the frequency characteristics with humidity load is decreased, and also, (c) it is preferable that X>1.00 because the variation in the initial characteristics is decreased.

An acoustic wave device according to another preferred embodiment of the present invention is described with reference to FIG. 2.

Figure 2:
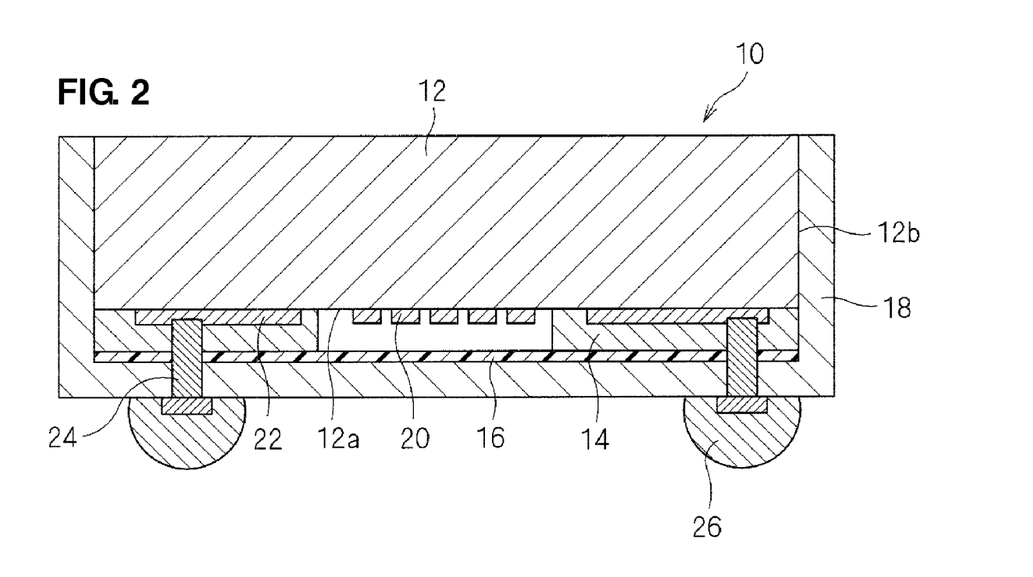
FIG. 2 is a sectional view of an acoustic wave device according to another preferred embodiment of the present invention.

FIG. 2 is a sectional view of an acoustic wave device 10 according to this preferred embodiment. As shown in FIG. 2, the acoustic wave device 10 includes an acoustic wave element in which an IDT electrode 20, pads 22, and a wiring pattern (not shown) are provided using a metal film or other suitable materials on the lower surface 12a of a substrate 12.

The lower surface 12a of the substrate 12 is covered with a sheet 16 including an insulating film with a support layer 14 disposed therebetween around the IDT electrode 20 using an insulating material.

A protective film 18 is provided on the outside of the sheet 16. The protective film 18 is arranged to continuously extend from the top of the sheet 16 to the side surface 12b of the substrate 12. More specifically, the protective film 18 is arranged on each of the chips divided from a wafer-shaped assembly substrate. The IDT electrode 20 of the acoustic wave element is sealed with the protective film 18.

Bumps 26 are provided on the outside of the protective film 18 using solder or other suitable material. The bumps 26 are electrically connected to the pads 22 through via conductors 24 disposed in through holes provided in the support layer 14, the sheet 16, and the protective film 18.

The protective film 18 is preferably a silicon nitride film formed to be silicon-rich, for example. In other words, when the Si:N composition ratio of the protective film 18 is represented by 1:X, for example, X≦1.15.

The silicon-rich silicon nitride film used as the protective film 18 is prevented from being oxidized in a wet atmosphere and is highly effective to prevent moisture permeation as compared to a silicon nitride film having a typical composition ratio. The high moisture permeation suppression effectively prevents changes with moisture of the IDT electrode 20 or other elements provided inside the protective film 18. In addition, the oxidation of the protective film 18 is prevented, thereby causing only very small changes to the function of the protective film over time.

Therefore, the characteristics of the acoustic wave device 10 can be stabilized.

An acoustic wave device 30 according to another preferred embodiment of the present invention is described with reference to FIG. 3.

Figure 3:
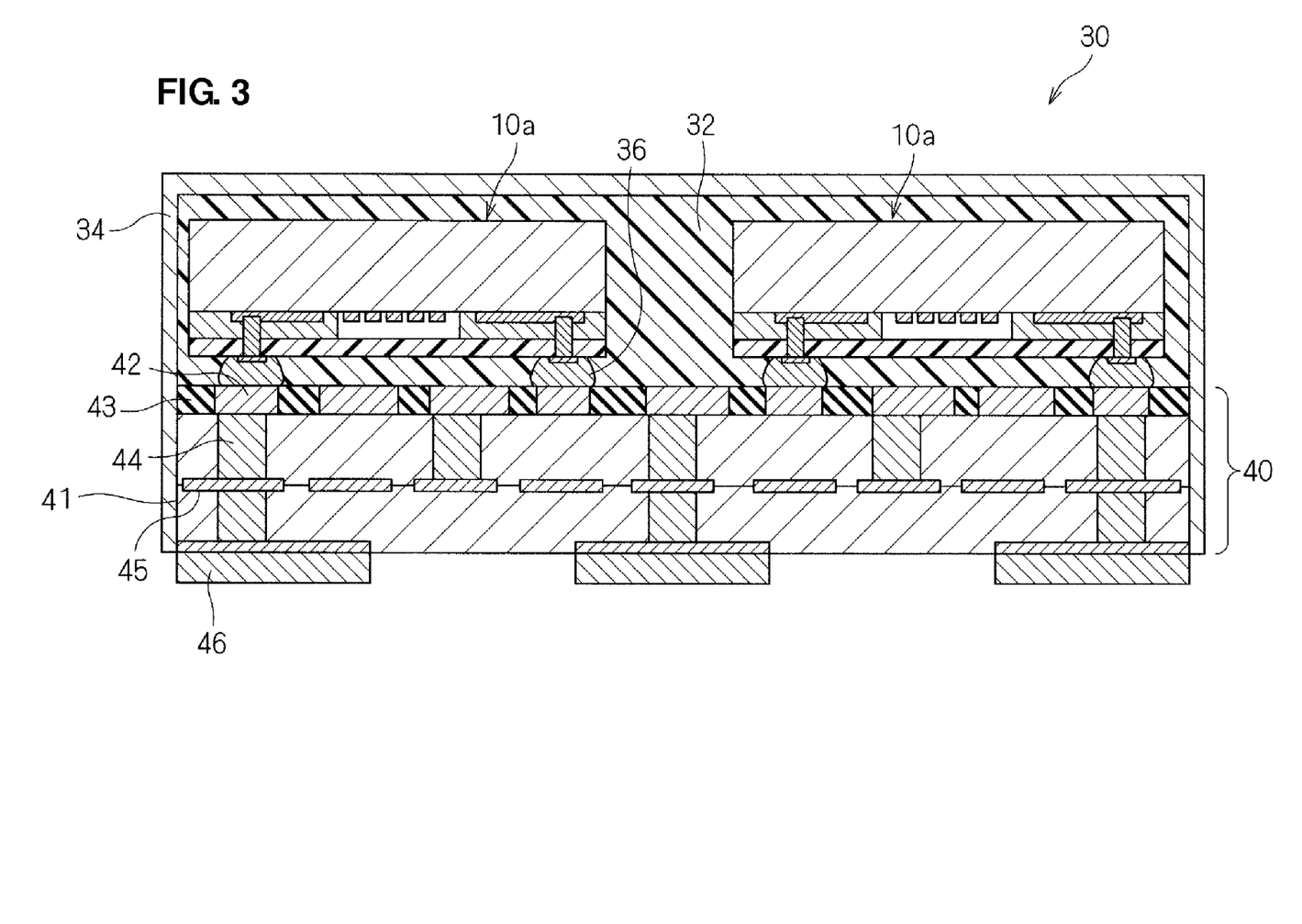
FIG. 3 is a sectional view of an acoustic wave device according to another preferred embodiment of the present invention.

As shown in a sectional view of FIG. 3, the acoustic wave device 30 includes electronic components 10a mounted on a common substrate 40 via conductive members 36 preferably made of solder or other suitable material. The electronic component 10a is surrounded by a protective resin 32. For example, the electronic components 10a are buried in the protective resin 32 including an epoxy semi-cured sheet or other suitable material.

A silicon-rich silicon nitride film is provided as a protective film 34 over the entire outer surface of the protective resin 32. The protective film 34 continuously extends from the top of the protective resin 32 to the side surface 41 of the common substrate 40.

The electronic components 10a mounted on the common substrate 40 can be configured in substantially the same manner as the acoustic wave device 10. Since the electronic components 10a are sealed with the protective film 34, the protective film 18 as in the acoustic wave device 10 is not necessarily provided on the electronic components 10a.

The common substrate 40 is, for example, a laminated substrate including a plurality of laminated layers, and a conductive pattern 42 and a resist pattern 43 are provided on one of the main surfaces, external electrodes 46 being provided on the other main surface. In the common substrate 40, interlayer connecting conductors 44 which pass through the layers to connect the layers to each other and an internal wiring pattern 45 disposed between the layers are preferably provided, for example.

The silicon-rich silicon nitride film used as the protective film 34 of the acoustic wave device 30 is prevented from being oxidized in a wet atmosphere and is highly effective to prevent moisture permeation as compared to a silicon nitride film having a typical composition ratio. The highly effective moisture permeation prevention causes effectively prevents changes with moisture inside the protective film 34. In addition, the oxidation of the protective film 34 is prevented, thereby causing very little change of the function of the protective film over time.

Therefore, changes with moisture of the electronic component 10a inside the protective film 34 are very effectively prevented.

As described above, by forming a silicon-rich silicon nitride film used as a protective film of an acoustic wave device, a decrease in the function of the protective film can be prevented, and the characteristics of the acoustic wave device can be stabilized.

The present invention is not limited to the above-described preferred embodiments, and various modifications can be made.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. An acoustic wave device comprising:
   an acoustic wave element including an interdigital electrode provided on a substrate; and
   a protective film arranged to cover the acoustic wave element; wherein
   the protective film is a silicon nitride film composed of silicon and nitrogen as main components, and when a composition ratio of the silicon to the nitrogen is represented by 1:X, X is greater than 0 and about 1.15 or less.

2. The acoustic wave device according to claim 1, wherein the acoustic wave element further includes a $SiO_2$ film provided on the substrate including the interdigital electrode, and the protective film is disposed on the $SiO_2$ film.

3. The acoustic wave device according to claim 1, wherein the acoustic wave element further includes a cover sheet arranged on the substrate so as to define a space on the interdigital electrode, and the protective film is disposed on the cover sheet.

4. The acoustic wave device according to claim 1, further comprising:
   a common substrate on which a plurality of the acoustic wave elements are mounted; wherein
   the protective film is arranged to cover the plurality of acoustic wave elements mounted on the common substrate.

5. The acoustic wave device according to claim 1, wherein X is greater than about 1.00.

6. The acoustic wave device according to claim 1, wherein X is less than about 1.00.

7. The acoustic wave device according to claim 1, wherein X is less than about 0.60.

8. The acoustic wave device according to claim 1, wherein X is greater than about 0.2.

9. The acoustic wave device according to claim 1, wherein X is in a range from about 0.20 to about 0.60.

* * * * *